(12) United States Patent
Yamada

(10) Patent No.: US 8,779,954 B2
(45) Date of Patent: Jul. 15, 2014

(54) AD (ANALOG-TO-DIGITAL) CONVERSION CIRCUIT, MICRO-CONTROLLER, AND METHOD OF ADJUSTING SAMPLING TIME

(71) Applicant: Lapis Semiconductor Co., Ltd., Hachioji (JP)

(72) Inventor: Toshimi Yamada, Hachioji (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 13/777,199

(22) Filed: Feb. 26, 2013

(65) Prior Publication Data

US 2013/0229295 A1 Sep. 5, 2013

(30) Foreign Application Priority Data

Mar. 2, 2012 (JP) ................................. 2012-047127

(51) Int. Cl.
*H03M 1/00* (2006.01)

(52) U.S. Cl.
USPC .......................................... 341/122; 341/155

(58) Field of Classification Search
USPC .......................................... 341/122, 155, 123
See application file for complete search history.

(56) References Cited

U.S. PATENT DOCUMENTS

| 6,337,651 | B1 * | 1/2002 | Chiang | 341/161 |
| 7,333,039 | B2 * | 2/2008 | Lu et al. | 341/122 |
| 7,969,336 | B2 * | 6/2011 | Yoshioka | 341/122 |
| 8,441,380 | B2 * | 5/2013 | Redfern et al. | 341/122 |

FOREIGN PATENT DOCUMENTS

| JP | 04-220016 A | 8/1992 |
| JP | 07-264071 A | 10/1995 |

* cited by examiner

*Primary Examiner* — Brian Young
(74) *Attorney, Agent, or Firm* — Kubotera & Associates, LLC

(57) ABSTRACT

An AD (analog-to-digital) conversion circuit includes a capacitor array formed of a plurality of capacitors; a sample hold circuit configured to apply an analog input voltage input through an input terminal to the capacitor array so that the analog input voltage is accumulated in the capacitor array until a sampling time set is elapsed; a comparator circuit configured to sequentially retrieve the analog input voltage accumulated in each of the capacitors of the capacitor array, and to compare the analog input voltage with a reference voltage defined in advance to generate a digital signal; and a sampling time adjusting circuit configured to measure a period of time when a voltage on an input side of the sample hold circuit reaches a threshold value defined in advance relative to the reference voltage, and to set a time determined according to the period of time as the sampling time.

14 Claims, 5 Drawing Sheets

AD (ANALOG-TO-DIGITAL) CONVERSION CIRCUIT, MICRO-CONTROLLER, AND METHOD OF ADJUSTING SAMPLING TIME

BACKGROUND OF THE INVENTION AND RELATED ART STATEMENT

The present invention relates to an analog-to-digital conversion circuit (referred to as an AD conversion circuit) of a successive approximation type having a sample-and-hold function. More specifically, the present invention relates to an AD conversion circuit, a micro-controller, and a method of adjusting a sampling time suitable for automatically adjusting a sampling time of an input value according to an input impedance that is changed depending on an external device connected thereto.

In general, a conventional AD conversion circuit having a sample-and-hold function is formed of a relatively simple circuitry configuration. Further, the conventional AD conversion circuit has a high compatibility with a COMS process capable of producing a circuit at a low cost, and tends to have a relatively small occupancy area. Accordingly, the conventional AD conversion circuit can be constituted by an LSI (Large Scale Integration), and is easy to be disposed in a micro-controller (MCU).

In the conventional AD conversion circuit, an analog input voltage is applied to a plurality of capacitor elements, so that electric charges corresponding to the analog input voltage are accumulated in each of the capacitor elements. As a result, the conventional AD conversion circuit is capable of holding a voltage corresponding to the electric charges thus accumulated. Then, the voltage is compared with an internal reference voltage of the conventional AD conversion circuit, so that the analog input voltage is output at a digital value associated with a resolution of the conventional AD conversion circuit.

It is noted that in the following description, the process of accumulating the electric charges corresponding to the analog input voltage into the capacitor elements is referred to simply as a process of charging the analog input voltage into the capacitor elements for the sake of a simple explanation.

In the conventional AD conversion circuit described above, in order to reduce the number of peripheral components, the capacitor elements, in which the analog input voltage is charged, may be disposed inside the conventional micro-controller, thereby constituting a conventional sample-and-hold circuit (referred to also as a conventional sample hold circuit).

A configuration and an operation of a conventional AD conversion circuit with six bits shown in FIG. 5 will be explained next. FIG. 5 is a circuit diagram showing an example of the configuration of the conventional AD conversion circuit.

As shown in FIG. 5, after an analog input voltage Vain is charged in an internal capacitor element array 1, a switch S1 is turned off, so that the analog input voltage Vain is separated from a C ladder 3. Afterward, the conventional AD conversion circuit starts an AD conversion operation (a conversion from an analog signal to a digital signal). When the conventional AD conversion circuit starts the AD conversion operation, a control circuit 2 formed of a digital log circuit controls switches SW1 to SW7 and a switch S4 to connect each of capacitor elements of the internal capacitor element array 1 to one of a reference voltage Vref and ground GND.

In the conventional AD conversion circuit, a convertor circuit 4 is connected to one end portion Cin of the internal capacitor element array 1, so that the convertor circuit 4 outputs a signal with a High level or a Low level according to a result of the AD conversion operation.

In the conventional AD conversion circuit, when the comparator circuit 4 performs the AD conversion operation, the control circuit 2 controls the comparator circuit 4 according to a reference clock signal CLK and a control signal transmitted from a micro-computer (not shown) disposed inside the LSI together with the conventional AD conversion circuit. After the comparator circuit 4 outputs to the control circuit 2, the control circuit 2 outputs the conversion result to the micro-computer.

In the conventional AD conversion circuit having the configuration described above, the internal capacitor element array 1 is capable of charging an electric charge Q as a whole, wherein the electric charge Q can be defined as follows:

$$Q = 64\,\text{pF} \times (Vt - Vain)$$

where Vt is a threshold voltage of the comparator circuit 4. At this moment, the switch S1 for inputting the analog input voltage Vain and the switches S2 and S3 of the comparator circuit 4 are turned on (in the connected state).

After the charging period, the control circuit 2 controls the switch S1 for inputting the analog input voltage Vain and the switches S2 and S3 of the comparator circuit 4 to turn off (in the disconnected state). Accordingly, the internal capacitor element array 1 holds the electric charge Q until the comparator circuit 4 completes the AD conversion operation.

In the conventional AD conversion circuit, for example, when the comparator circuit 4 converts the highest bit through the AD conversion operation, only the capacitor element of 32 pF is connected to the side of the analog input voltage (or the reference voltage Vref) through the switch SW1, and other capacitor elements are connected to the ground GND through the switches SW2 to SW7 and the switch S4.

It should be noted that the conventional AD conversion circuit is capable of converting 10 bit (bit 9 to bit 0), and bit 9 is the highest bit. Accordingly, in the connection state described above, when a voltage V9 is applied to the one end portion Cin of the internal capacitor element array 1 (the side of the comparator circuit 4), since the electric charge Q accumulated in the internal capacitor element array 1 is maintained constant, the following equation (1) is established:

$$Q = 64\,\text{pF} \times (Vt - Vain) = 32\,\text{pF} \times (V9 - Vref) + 32\,\text{pF} \times (V9 - GND) \tag{1}$$

In the conventional AD conversion circuit, when a conversion voltage range is set from the power voltage VDD to the ground GND (0 V), that is, from the reference voltage Vref equal to the power voltage VDD (Vref=VDD) to the ground GND equal to 0 V (GND=0 V), a difference between the threshold voltage Vt and the voltage V9 (Vt−V9), which corresponds to a voltage variance at the one end portion Cin (an input portion) of the comparator circuit 4, is given as follows:

$$Vt - V9 = Vain - (\tfrac{1}{2}) \times VDD$$

In the conventional AD conversion circuit, the comparator circuit 4 is configured to determine the conversion result whether the voltage V9 is greater than the threshold voltage Vt. More specifically, when the analog input voltage Vain is greater than the half of the power voltage VDD (Vain>(½)×VDD), the voltage V9 is smaller than the threshold voltage Vt (V9<Vt), so that the conversion result is "1" (High). When the analog input voltage Vain is smaller than the half of the power voltage VDD (Vain<(½)×VDD), the voltage V9 is greater than the threshold voltage Vt (V9>Vt), so that the conversion result is "0" (Low).

Accordingly, in the conventional AD conversion circuit, the comparator circuit 4 is configured to determine the conversion result of the highest bit when the analog input voltage Vain is greater than the half of the power voltage VDD. It is noted that the comparator circuit 4 is configured to convert the other bit through the operation similar to that of the highest bit.

In the conventional AD conversion circuit having the configuration described above, however, when the analog input voltage Vain is charged in the internal capacitor element array 1, that it, when the input value is sampled, the following problems tend to occur.

For example, in the conventional AD conversion circuit, a period of time during which the analog input voltage Vain is sampled is determined by a time constant of the internal capacitor element array 1 and an input impedance of the conventional AD conversion circuit. Currently, in order to reduce the conversion time of the conventional AD conversion circuit, it has been tried to reduce the value of the input impedance. However, depending on the input impedance of the conventional AD conversion circuit, it may be difficult to secure a sufficient period of time during which the analog input voltage Vain is sampled. In this case, the conventional AD conversion circuit may output an erroneous conversion result. If this is the case, it is necessary to define the value of the input impedance.

However, in the conventional AD conversion circuit, the value of the input impedance is determined by an external device connected to the micro-controller that is provided with the conventional AD conversion circuit. Accordingly, it is difficult to determine the value of the input impedance on the side of the micro-controller unless the external device to be connected to the micro-controller is identified.

Alternatively, the value of the input impedance may be defined in advance as the specification thereof. In this case, it is difficult for a user to obtain desirable design flexibility. Further, it may be configured such that a plurality of sampling times is defined in advance, so that it is possible to select one of the sampling times. However, in order to configure the conventional AD conversion circuit as such, it is necessary to install a register and the like, thereby increasing a cost thereof.

Patent References 1 and 2 have disclosed conventional technologies relating to the sampling time in the conventional AD conversion circuits.

Patent Reference 1: Japanese Patent Publication No. 04-220016

Patent Reference 2: Japanese Patent Publication No. 07-264071

Patent Reference 1 has disclosed the conventional AD conversion circuit of a successive approximation type. The conventional AD conversion circuit disclosed in Patent Reference 1 includes an analog switch for controlling an input of an analog signal to be converted to a digital signal; a switch circuit portion to be used for sampling the analog signal; a capacitor element array portion formed of a plurality of capacitor elements weighed in a binary fashion; and a comparator portion for generating the digital signal as an output signal. Further, the conventional AD conversion circuit disclosed in Patent Reference 1 includes an amplifier disposed between the analog switch and the switch circuit portion. The amplifier is configured to have a gain of "1", a high input impedance, and a low output impedance.

With the conventional AD conversion circuit disclosed in Patent Reference 1, when the analog signal is sampled, the charging time for charging the capacitor of the capacitor element array portion is dependent on the low output impedance of the amplifier, thereby making it possible to reduce the charging time.

Patent Reference 2 has disclosed another conventional AD conversion circuit of a successive approximation type. The conventional AD conversion circuit disclosed in Patent Reference 2 includes a sample hold circuit for sampling an analog input signal; a comparator for sequentially comparing an output voltage of the sample hold circuit with a plurality of analog reference voltages ANs sequentially output from a D/A converter; and a sequential comparison register for storing a comparison result, so that the comparison result is output as a digital output signal Dout.

Further, the conventional AD conversion circuit disclosed in Patent Reference 2 includes a control circuit configured to operate according to a clock signal, so that the control circuit controls a sampling operation and a successive approximation operation.

Further, the conventional AD conversion circuit disclosed in Patent Reference 2 includes a clock signal selection circuit for generating a plurality of clock signals according to a reference clock signal CLK, so that the clock signal selection circuit selects one of the clock signals and outputs to the control circuit as an operation clock signal CLKM.

Further, the conventional AD conversion circuit disclosed in Patent Reference 2 includes a selection control circuit for changing the clock signal selected with the clock signal selection circuit according to the power source voltage, so that the selection control circuit changes a sampling operation time and a successive approximation operation time.

In the conventional technologies disclosed in Patent References 1 and 2, however, it is difficult to automatically set the sampling time according to the value of the input impedance that varies depending on the external device to be connected to the conventional AD conversion circuit according to a usage.

In view of the problems described above, an object of the present invention is to provide an AD conversion circuit, a micro-controller, and a method of adjusting a sampling time. In the present invention, it is possible to automatically set the sampling time according to the value of the input impedance that varies depending on the external device to be connected to the AD conversion circuit according to a purpose.

Further objects and advantages of the invention will be apparent from the following description of the invention.

SUMMARY OF THE INVENTION

In order to attain the objects described above, according to a first aspect of the present invention, an AD conversion circuit includes a capacitor array; a sample hold circuit; a comparator circuit; and a sampling time adjusting circuit.

According to the first aspect of the present invention, in the AD conversion circuit, the capacitor array is formed of a plurality of capacitors. The sample hold circuit is configured to apply an analog input voltage input through an input terminal to the capacitor array so that the analog input voltage is accumulated in the capacitor array until a sampling time set is elapsed. The comparator circuit is configured to sequentially retrieve the analog input voltage accumulated in each of the capacitors of the capacitor array. Further, the comparator circuit is configured to compare the analog input voltage with a reference voltage defined in advance to generate a digital signal.

According to the first aspect of the present invention, in the AD conversion circuit, the sampling time adjusting circuit is configured to measure a period of time when a voltage on an input side of the sample hold circuit, which increases according to an adjustment voltage input from an external device connected to the input terminal, reaches a threshold value defined in advance relative to the reference voltage. Further, the sampling time adjusting circuit is configured to set a time determined according to the period of time thus measured as the sampling time.

According to a second aspect of the present invention, a micro-controller includes the AD conversion circuit in the first aspect and a central processing device for performing a process according to a program including an operation control of the AD conversion circuit.

According to a third aspect of the present invention, a method is used for adjusting a sampling time in an AD conversion circuit.

According to the third aspect of the present invention, the AD conversion circuit includes a capacitor array; a sample hold circuit; and a comparator circuit.

According to the third aspect of the present invention, in the AD conversion circuit, the capacitor array is formed of a plurality of capacitors. The sample hold circuit is configured to apply an analog input voltage input through an input terminal to the capacitor array so that the analog input voltage is accumulated in the capacitor array until a sampling time set is elapsed. The comparator circuit is configured to sequentially retrieve the analog input voltage accumulated in each of the capacitors of the capacitor array. Further, the comparator circuit is configured to compare the analog input voltage with a reference voltage defined in advance to generate a digital signal.

According to the third aspect of the present invention, the method of adjusting the sampling time in the AD conversion circuit includes a first step of measuring a period of time when a voltage on an input side of the sample hold circuit, which increases according to an adjustment voltage input from an external device connected to the input terminal, reaches a threshold value defined in advance relative to the reference voltage. Further, the method of adjusting the sampling time in the AD conversion circuit includes a second step of setting a time determined according to the period of time thus measured as the sampling time.

In the present invention, in the AD conversion circuit and the micro-controller provided with the AD conversion circuit, it is possible to automatically set the sampling time according to an input impedance value varying depending on the external device connected thereto based on an intended use.

DETAILED DESCRIPTION OF PREFERRED EMBODIMENTS

Hereunder, preferred embodiments of the present invention will be explained with reference to the accompanying drawings.

Figure 1:
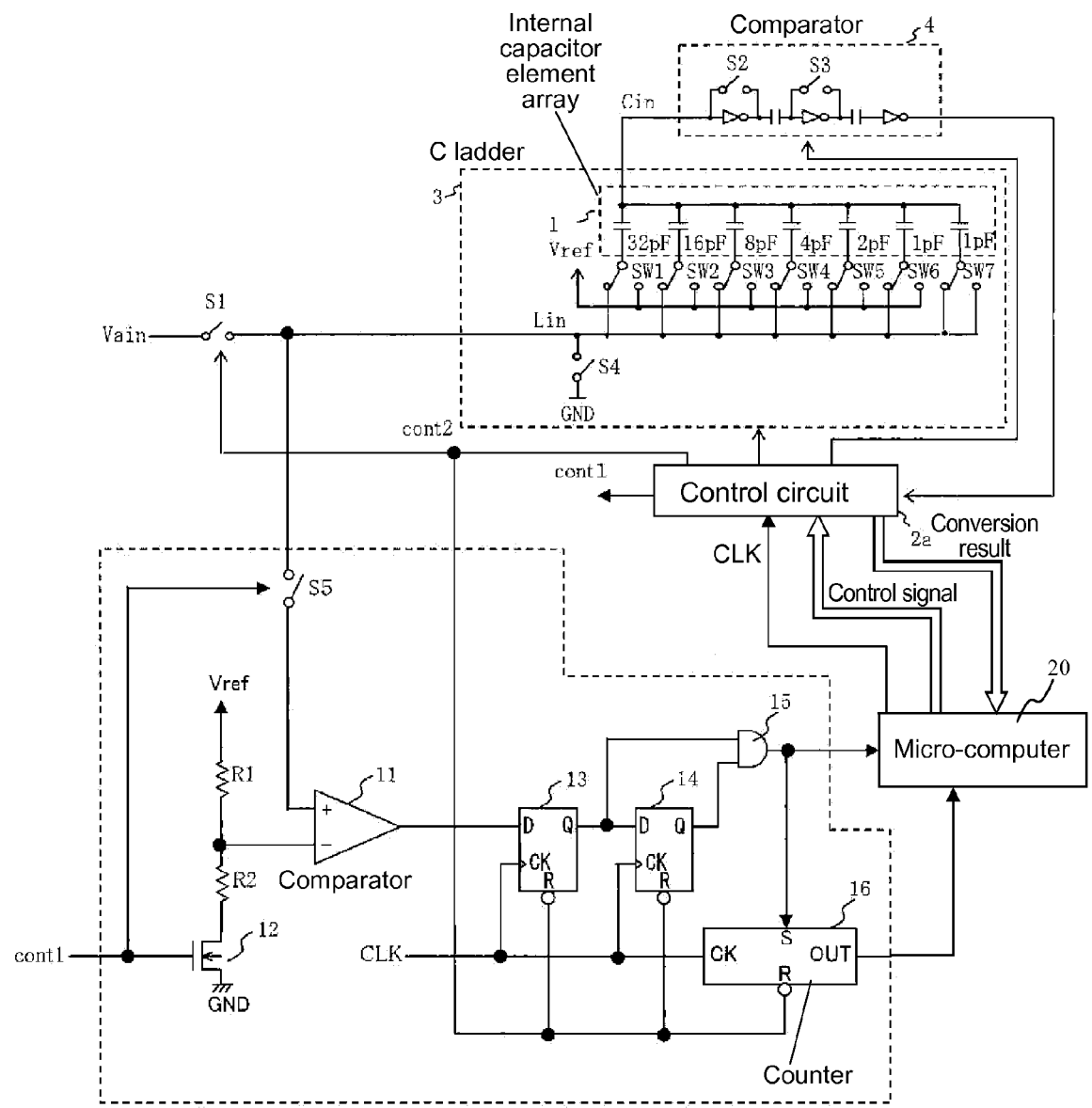
FIG. 1 is a circuit diagram showing an example of a configuration of an AD (analog-to-digital) conversion circuit according to an embodiment of the present invention.
Figure 5:
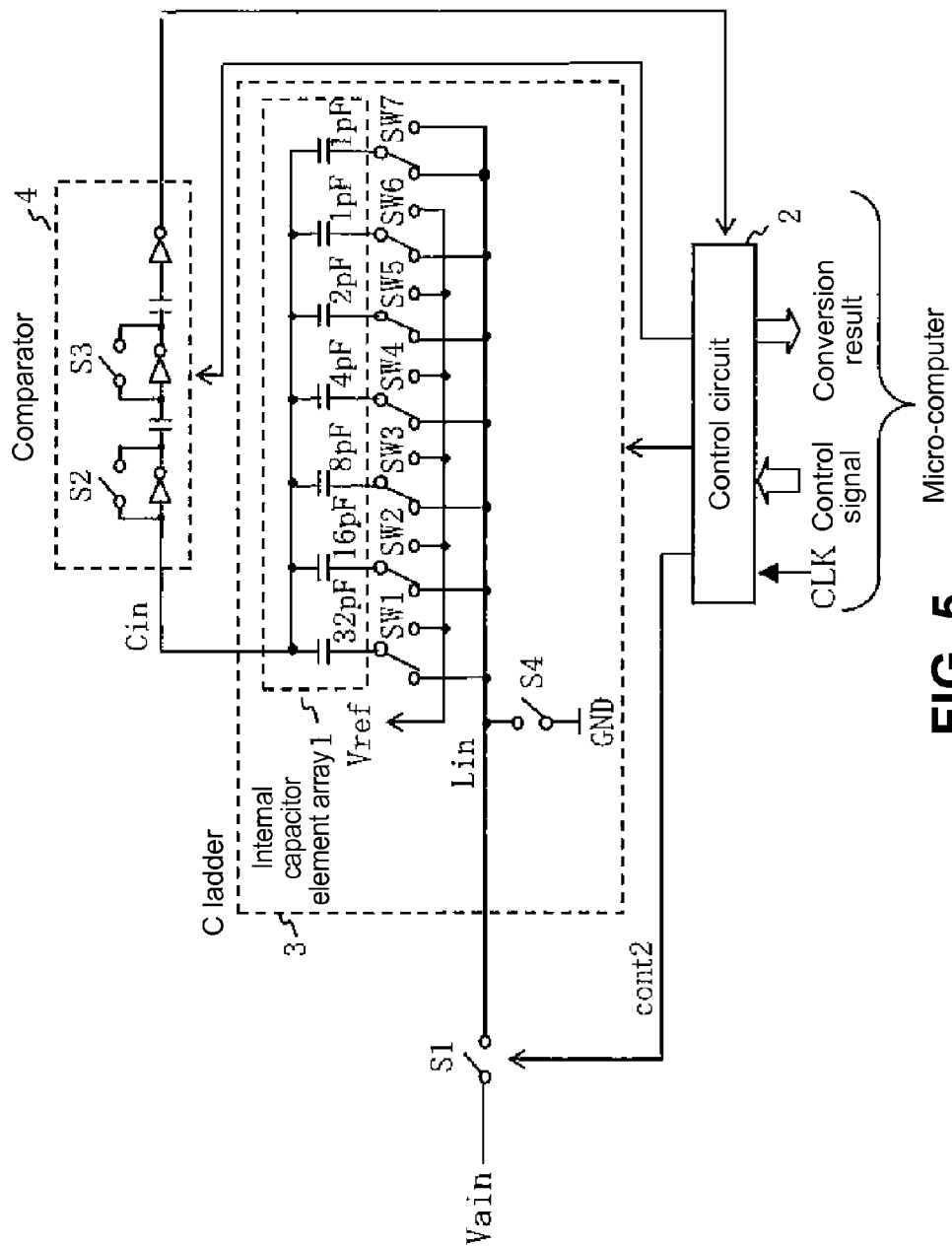
FIG. 5 is a circuit diagram showing an example of a configuration of a conventional AD conversion circuit.

FIG. 1 is a circuit diagram showing an example of a configuration of an AD (analog-to-digital) conversion circuit according to an embodiment of the present invention. As shown in FIG. 1, in addition to the components of the configuration of the conventional AD conversion circuit shown in FIG. 5, the AD conversion circuit according to the embodiment of the present invention further includes a sampling time adjusting circuit.

As shown in FIG. 1, the AD conversion circuit includes a sample hold circuit and a comparator circuit (a circuit portion for performing an AD conversion). The sample hold circuit and the comparator circuit have configurations similar to those of the conventional AD conversion circuit shown in FIG. 5. Further, the sample hold circuit and the comparator circuit are configured to perform operations similar to those of the conventional AD conversion circuit shown in FIG. 5.

In the embodiment, the AD conversion circuit includes a control circuit 2a. The control circuit 2a performs an operation different from that of the conventional AD conversion circuit shown in FIG. 5. Accordingly, in the following description, the AD conversion operation of the AD conversion circuit will not be described in detail, and instead the configuration and the operation of the sampling time adjusting circuit will be mainly explained in more detail.

In the embodiment, the sampling time adjusting circuit includes a comparator 11; an NMOS transistor 12; D flip-flops with a reset (referred to as flip-flops) 13 and 14; a double input AND gate 15; a counter 16; resistors R1 and R2; and a switch S5. Further, the sampling time adjusting circuit includes a storage device (such as a non-volatile storage device) and a micro-computer 20 (such as a central processing unit or CPU) for realizing a specific function of the AD conversion circuit.

In the embodiment, the AD conversion circuit further includes an internal capacitor element array 1; a C ladder 3; and a comparator 4. Further, the C ladder 3 includes an input line Lin connected to the internal capacitor element array 1. Further, the comparator 11 includes a plus input terminal (a non-inverted input terminal) such that the input line Lin is connected to the plus input terminal through the switch S5. Further, the comparator 11 includes a minus input terminal (an inverted input terminal), so that a voltage obtained by dividing a reference voltage Vref with the resistors R1 and R2 is input to the minus input terminal of the comparator 11.

In the embodiment, the NMOS transistor 12 includes a drain terminal connected to the resistor R2 and a source terminal connected to ground. Further, the NMOS transistor 12 includes a gate terminal for inputting a signal cont1, so that the signal cont1 controls an on/off state of the switch S5. It is noted that the control circuit 2a is configured to output the signal cont1 according to a control signal from the micro-computer 20.

In the embodiment, the comparator 11 includes an output terminal connected to a D input terminal of the flip-flop 13. Further, the flip-flop 13 includes a Q output terminal connected to a D input terminal of the flip-flop 14 and one of input terminals of the double input AND gate 15. Further, the flip-flop 14 includes a Q output terminal connected to the other of the input terminals of the double input AND gate 15.

In the embodiment, the flip-flop 13 further includes a clock terminal CK and a reset terminal R respectively connected to a clock terminal CK and a reset terminal R of the flip-flop 14. The reference clock signal CLK is input to the control circuit 2a and the clock terminals CK of the flip-flop 13 and the flip-flop 14. A signal cont2 is output from the control circuit 2a, and input to the reset terminals R of the flip-flop 13 and the flip-flop 14. The signal cont2 output from the control circuit 2a is also input to the switch SW1.

In the embodiment, the counter 16 includes a clock input terminal CK such that the reference clock signal CLK is input to the clock input terminal CK. Further, the counter 16 includes a reset terminal R such that the signal cont2 is input to the reset terminal R.

In the embodiment, the counter 16 further includes a stop terminal S such that the output terminal of the double input AND gate 15 is connected to the stop terminal S. When the double input AND gate 15 outputs a signal to the stop terminal S, the counter 16 stops a counting operation. Further, the output terminal of the double input AND gate 15 and the output terminal OUT of the counter 16 are connected to the micro-computer 20.

An operation of adjusting a sampling time in the AD conversion circuit with the configuration described above will be explained next. It should be noted that when the operation of adjusting the sampling time is performed, the AD conversion operation of the AD conversion circuit is stopped.

First, the AD conversion circuit is connected to an external device that is a setting subject of the AD conversion circuit. Accordingly, an analog input voltage Vain is input from the external device to an input terminal of the AD conversion circuit. An adjustment voltage Vref having a level the same as that of the reference voltage Vref is also input to the input terminal.

In this state, the reference clock signal CLK is input. At the same time, in the control circuit 2a, the signal cont1 is changed from a "Low" level to a "High" level according to the control signal transmitted from the micro-computer 20.

In the embodiment, when the signal cont1 is changed from the "Low" level to the "High" level, the NMOS transistor 12 and the switch S5 are both turned on, and the adjustment voltage Vref is input to the plus input terminal of the comparator 11. Further, the voltage obtained by dividing the reference voltage Vref with the resistors R1 and R2 (Vref×R2/(R1+R2)) is input to the minus input terminal of the comparator 11.

From the state described above, the control circuit 2a changes the signal cont2 from the "High" level to the "Low" level. When the signal cont2 is changed from the "High" level to the "Low" level, the switch S1 is turned on. Further, the flip-flop 13, the flip-flop 14 and the counter 16 are reset. After the flip-flop 13, the flip-flop 14 and the counter 16 are reset, the counter 16 starts the counting operation.

As described above, when the switch S1 is turned on, the voltage at the plus input terminal of the comparator 11 is increased to become the reference voltage Vref at a speed according to a time constant τ between the input impedance of the external device connected to the AC conversion circuit and the internal capacitor element array 1 in the C ladder 3.

In the embodiment, the time constant τ can be expressed as follows:

$$\tau = 1 - \exp(-1/ZC)$$

where Z is the input impedance of the external device connected to the AC conversion circuit, and C is the capacitance of the internal capacitor element array 1. Accordingly, the time constant τ becomes 1τ at the voltage corresponding to 63.2% of the reference voltage Vref.

Accordingly, in the embodiment, it is configured to set the resistors R1 and R2, so that the voltage at the minus input terminal of the comparator 11 becomes 63.2% of the reference voltage Vref. For example, when the sum of the resistivity values of the resistors R1 and R2 is equal to 100 R, it is configured to set the resistor R1 to 36.8 R and the resistor R2 to 63.2 R.

In the embodiment, it is configured to set the resistor R1 to 36.8 R and the resistor R2 to 63.2 R as described above. Accordingly, when the voltage at the minus input terminal of the comparator 11 exceeds 63.2% of the reference voltage Vref, the output of the comparator 11 is changed from the "Low" level to the "High" level. Then, the flip-flop 13 and the flip-flop 14 are configured to latch (hold) the output of the comparator 11.

In the embodiment, the two components, i.e., the flip-flop 13 and the flip-flop 14, are configured to latch (hold) the output of the comparator 11 twice. Accordingly, it is possible to prevent misdetection.

In the embodiment, when the output terminals Q of the flip-flop 13 and the flip-flop 14 are in the "High" level, the output of the double input AND gate 15 is changed from the "Low" level to the "High" level. It is noted that the change in the output becomes a notification signal for the micro-computer 20 to retrieve the counter value of the counter 16.

In the embodiment, the "High" level output of the double input AND gate 15 is input to the S terminal of the counter 16, so that the counter 16 stops the counting operation. Afterward, the counter value counted with the counter 16 is transmitted to the micro-computer 20 that controls the operation of the AD conversion circuit.

When the micro-computer 20 retrieves the counter value of the counter 16, the micro-computer 20 changes the signal cont1 and the signal cont2 to the "Low" level, so that the operation of the sampling time adjusting circuit of the AD conversion circuit is reset.

In the next step, the micro-computer 20 obtains a period of time using the counter value of the counter 16 thus retrieved. Then, the micro-computer 20 sets the period of time to the control circuit 2a as the sampling time of the analog input voltage in the sample hold circuit relative to the external device.

In the embodiment, the sampling time adjusting circuit is configured to set the sampling time through multiplying the period of time measured using the counter value by a value corresponding to an accuracy defined in advance.

For example, when the sampling time is set eightfold of the counter value (time of 1τ), the internal conversion capacitor is charged up to 99.9665% relative to the voltage fully charged in the internal conversion capacitor (τ=1−exp−8=0.999665). Accordingly, the error becomes 0.0335% relative to the voltage fully charged in the internal conversion capacitor at "τ=1−exp−8". In the case of a 10 bit AD conversion circuit, 1 LSB corresponds to about 0.097% ($1/2^{10}=1/1024$=about 0.00097). Accordingly, when the sampling time is set eightfold of the counter value (time of 1τ), the error corresponds to one-third of the accuracy at 10 bit (0.34 LSB). In other words, the internal conversion capacitor is charged at one-third of the accuracy at 10 bit (0.34 LSB), and it is suffice as the sampling time of the AD conversion circuit.

As described above, in the embodiment, the internal reference voltage is compared with the adjustment voltage. Then, the counter 16 is operated and counted at the operation clock of the AD conversion circuit until the adjustment voltage becomes greater than 63.2% of the internal reference voltage, so that the time constant τ of the input impedance of the external device and the internal conversion capacitor of the AD conversion circuit is determined. Then, using the counter value at that time, the sampling time of the input voltage Vain of the AD conversion circuit is set.

In the embodiment, when the sampling time is set through the process described above, the micro-computer 20 controls the operation of the AD conversion circuit such that the signal cont2 is turned on through the control circuit 2a. Further, the micro-computer 20 controls such that the sampling operation of the analog input voltage Vain is performed at the sampling time thus set. Afterward, the AD conversion operation is performed similar to the conventional AD conversion circuit.

In the embodiment, the storage unit (for example, the non-volatile storage unit) is provided for storing the period of time measured with the sampling time adjusting circuit and the sampling time thus set. Accordingly, when the AD conversion operation is performed, the AD conversion operation is performed relative to the external device using the sampling time thus stored. As a result, it is not necessary to measure and set the sampling time in the control circuit 2a every time when the AD conversion circuit is turned on.

As described above, in the sampling time adjusting circuit in the embodiment, the comparator 11 is configured to compare the adjustment voltage with the reference voltage, so that the signal indicating that the adjustment voltage reaches the threshold value is output. Then, the counter 16 is configured to measure the period of time from when the adjustment voltage starts being input to the sample hold circuit to when the comparator 11 outputs the signal. In the next step, the micro-computer 20 is configured to calculate the sample hold time using the period of time measured with the counter 16.

Further, in the embodiment, as described above, the threshold value is determined as the ratio of the adjustment voltage less than one relative to the reference voltage.

More specifically, in the sampling time adjusting circuit in the embodiment, the reference voltage Vref is divided with the resistors R1 and R2, and is input as the threshold value to the comparator 11. It is configured such that the resistivity values of the resistors R1 and R2 are set so that the adjustment voltage, which is increased according to the time constant τ of the input impedance and the internal conversion capacitor, is less than 100% of the reference voltage, and the signal is output from the comparator 11.

In particular, in the sampling time adjusting circuit in the embodiment, the resistivity values of the resistors R1 and R2 are set so that the voltage thus divided and input to the comparator 11 becomes 63.2% of the reference voltage.

Accordingly, in the embodiment, it is not necessary to wait until the adjustment voltage thus input becomes equal to the reference voltage. As a result, it is possible to determine the sampling time with the sufficient accuracy in a short period of time.

In the embodiment, the resistors R1 and R2 may be formed of variable resistors. When the resistors R1 and R2 are formed of variable resistors, it is possible to automatically adjust the sampling time with arbitrary accuracy.

Figure 2:
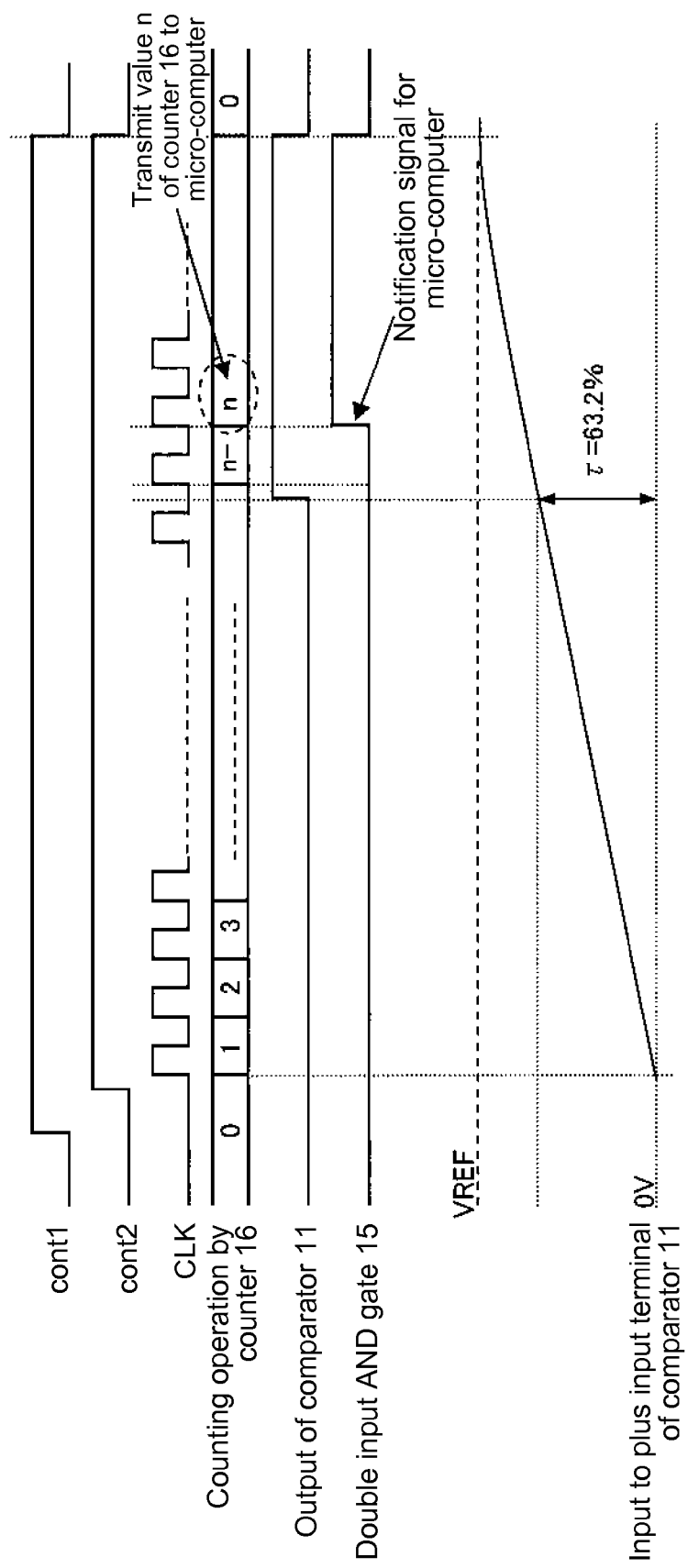
FIG. 2 is a time chart showing an example of an operation of the AD conversion circuit according to the embodiment of the present invention.

An operation of the sampling time adjusting circuit of the AD conversion circuit will be explained with reference to a time chart shown in FIG. 2. FIG. 2 is the time chart showing an example of the operation of the sampling time adjusting circuit of the AD conversion circuit according to the embodiment of the present invention.

First, from the external device connected to the AD conversion circuit as the setting subject, the adjustment voltage equal to the reference voltage Vref is input to the input terminal of the AD conversion circuit as the analog input voltage Vain. Accordingly, the reference voltage Vref is divided with the resistors R1 and R2, and the divided voltage (Vref×R2/(R1+R2)) is input to the minus input terminal of the comparator 11. In this state, the reference clock signal CLK is input, so that the signal cont1 is changed from the "Low" level to the "High" level. As a result, the adjustment voltage Vref is input to the plus input terminal of the comparator 11.

In the next step, from the state described above, when the signal cont2 is changed from the "Low" level to the "High" level, the counter 16 starts the counting operation (0, 1, 2, . . . , n).

In this state, the voltage at the plus input terminal of the comparator 11 is increased according to the time constant τ of the input impedance of the external device thus connected and the internal capacitor element array 1 of the C ladder 3. When the voltage becomes less than 63.2% of the reference voltage Vref applied to the minus input terminal, the output of the comparator 11 is changed from the "Low" level to the "High" level.

When the output of the comparator 11 is changed from the "Low" level to the "High" level, the output of the double input AND gate 15 is changed, so that the change becomes the notification signal for the micro-computer 20 to retrieve the counter value of the counter 16. More specifically, when the output of the double input AND gate 15 becomes the "High" level, the counter 16 stops the counting operation. Accordingly, the counter value n of the counter 16 upon stopping the counting operation is transmitted to the micro-computer 20.

In the next step, when the counter value n of the counter 16 is transmitted to the micro-computer 20, the micro-computer 20 uses the counter value thus transmitted to determine the period of time until the voltage, which is increased on the input side of the sample hold circuit according to the adjustment voltage Vref input from the external device, reaches the threshold value defined in advance relative to the reference voltage Vref (for example, 63.2% of the reference voltage Vref). Then, the micro-computer 20 sets the time determined according to the period of time as the sampling time of the analog input voltage of the sample hold circuit relative to the external device.

Figure 3:
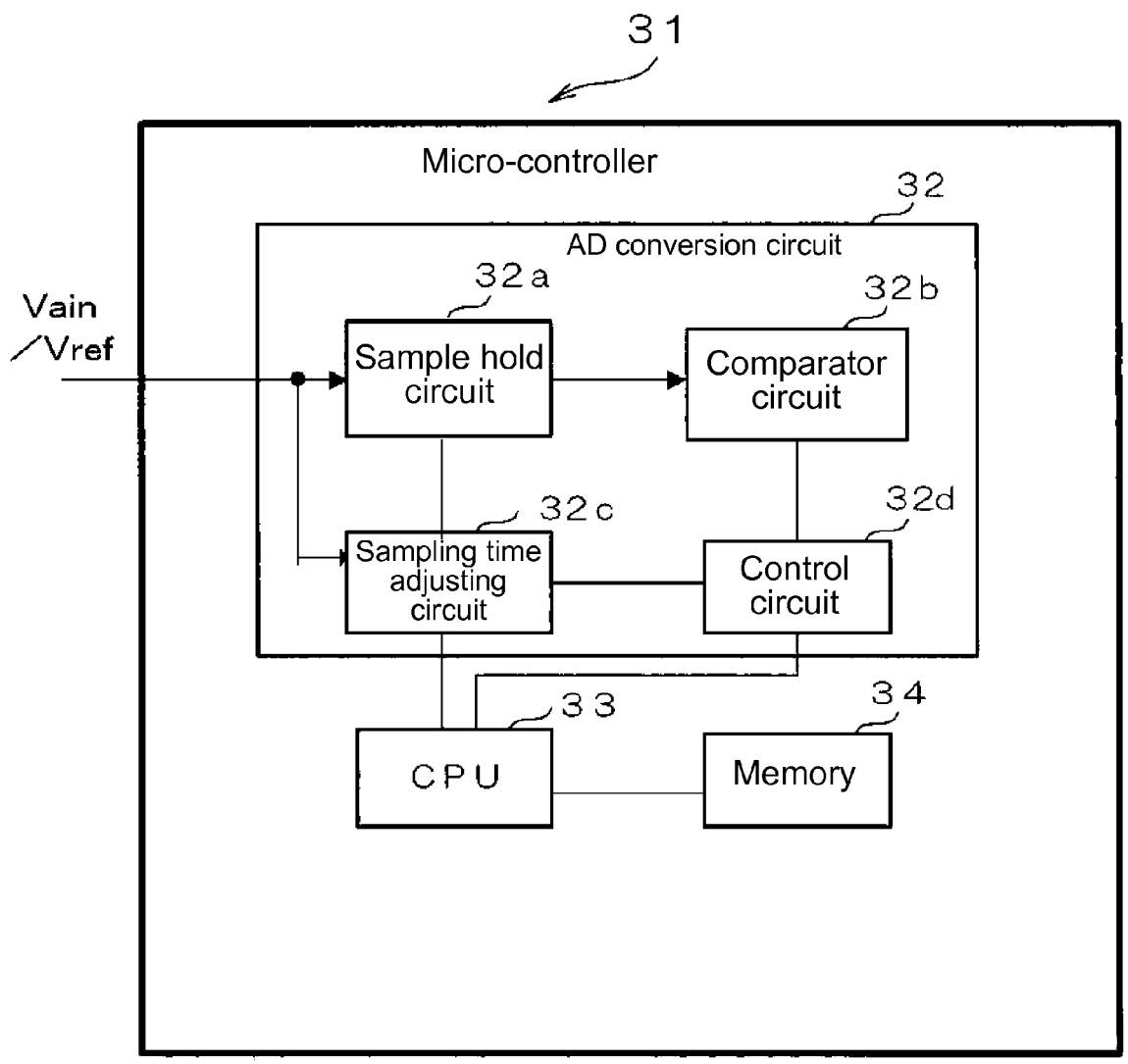
FIG. 3 is a block diagram showing an example of a configuration of a micro-controller provided with the AD conversion circuit according to the embodiment of the present invention.

A configuration of a micro-controller (a semiconductor device) 31 will be explained next with reference to FIG. 3. FIG. 3 is a block diagram showing an example of the configuration of the micro-controller 31 provided with the AD conversion circuit having the sampling time adjusting circuit described above according to the embodiment of the present invention.

As shown in FIG. 3, the micro-controller 31 includes an AD conversion circuit 32; a CPU (Central Processing Unit) 33; and a memory 34. Further, the AD conversion circuit 32 includes a sample hold circuit 32a; a comparator circuit 32b; a sampling time adjusting circuit 32c; and a control circuit 32d.

In the embodiment, the control circuit 32d is configured to receive a control signal output from a process executed according to a program of the CPU 33, so that the control circuit 32d controls operations of the sample hold circuit 32a, the comparator circuit 32b, and the sampling time adjusting circuit 32c.

In the embodiment, the sample hold circuit 32a includes the C ladder 3 shown in FIG. 1. Further, the comparator circuit 32b includes the comparator 4 shown in FIG. 1. Further, the sampling time adjusting circuit 32c includes the comparator 11, the NMOS transistor 12, the flip-flop 13, the flip-flop 14, the double input AND gate 15, the counter 16, the resistors R1 and R2, and the switch S5 shown in FIG. 1.

With the configuration described above, in the micro-controller 31 in the embodiment, the control circuit 32d controls the sample hold circuit 32a according to the process executed based on the program stored in the memory 34 of the CPU 33, so that the sample hold circuit 32a accumulates the analog input voltage in each of the capacitor elements of the internal capacitor element array 1 until the sampling time thus set. Further, the control circuit 32d controls the comparator circuit 32b to sequentially retrieve the analog input voltage accumulated in each of the capacitor elements, so that the comparator circuit 32b compares the analog input voltage with the reference voltage defined in advance to generate the digital signal.

In the embodiment, before the AD conversion operation is started, the control circuit 32d controls the sampling time adjusting circuit 32c to measure the period of time until the voltage, which is increased on the input side of the sample hold circuit according to the adjustment voltage equal to the reference voltage Vref input from the external device, reaches the threshold value defined in advance relative to the reference voltage Vref (for example, 63.2% of the reference voltage Vref). Then, the control circuit 32d sets the sampling time of the analog input voltage of the sample hold circuit 32a relative to the external device the time determined according to the period of time thus measured.

In the embodiment, it is noted that the micro-controller 31 is configured to externally output the digital signal converted with the AD conversion circuit 32 through an interface unit (not shown).

Figure 4:
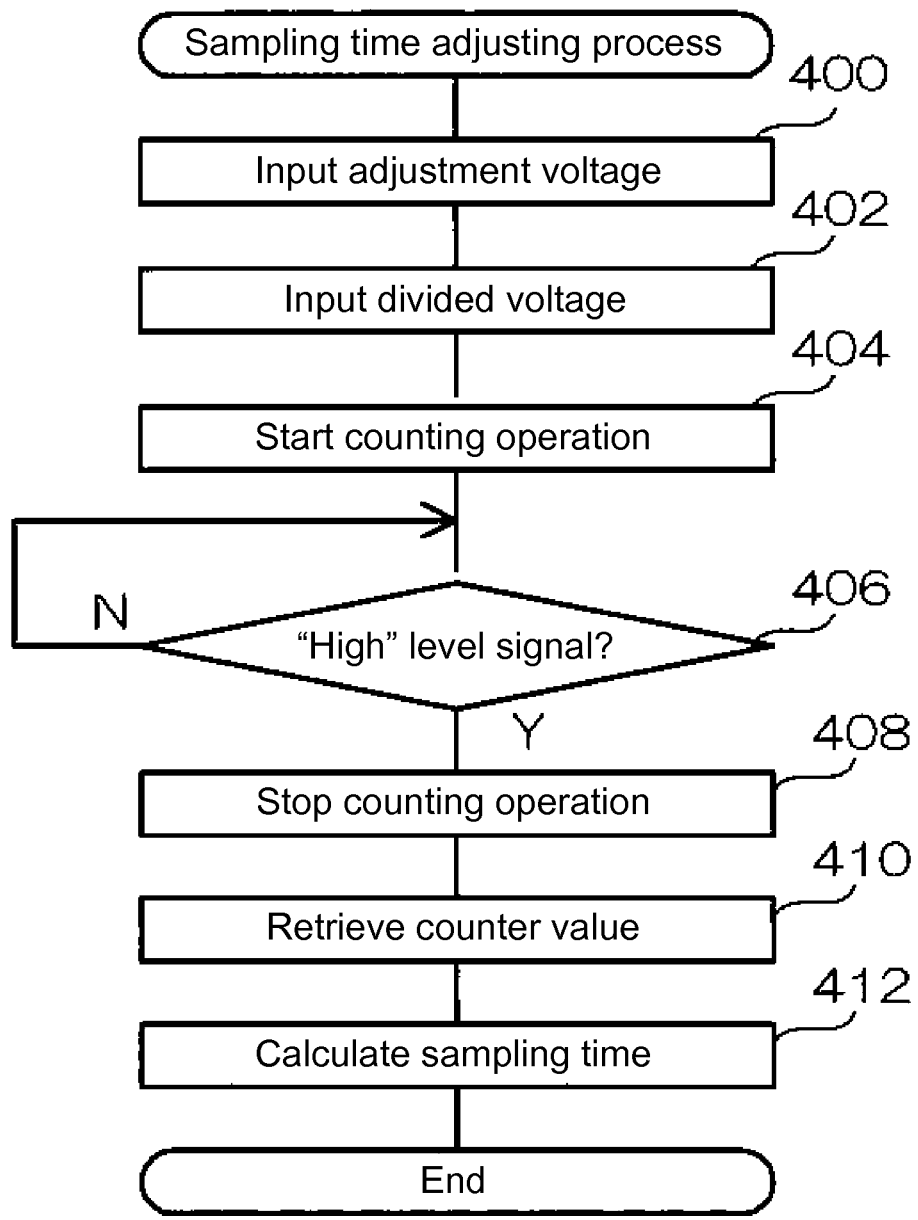
FIG. 4 is a flow chart showing an example of an operation of the method of adjusting the sampling time in the AD conversion circuit according to the embodiment of the present invention.

An operation of the sampling time adjusting circuit 32c based on the process of the CPU thus programmed will be explained next with reference to FIG. 4. FIG. 4 is a flow chart showing an example of the operation of the method of adjusting the sampling time in the AD conversion circuit according to the embodiment of the present invention.

In step 400, the adjustment voltage (Vref) is input to the input terminal of the analog input voltage. In step 402, the divided voltage corresponding to 63.2% of the adjustment voltage (Vref) is input to the minus input terminal of the comparator 11.

In step 404, the counter 16 starts the counting operation. In step S406, it is determined whether the comparator 11 outputs the "High" level signal. In step 408, when it is determined that the comparator 11 outputs the "High" level signal, the counter 16 stops the counting operation. In step 410, the counter value of the counter 16 is retrieved. In step 412, the sampling time is calculated using the counter value, thereby completing the process.

As described with reference to FIGS. 1 to 4, in the AD conversion circuit in the embodiment, the capacitor array is formed of a plurality of capacitors. The sample hold circuit is configured to accumulate the analog input voltage input through the input terminal to the capacitor array until the sampling time thus set is elapsed. The comparator circuit is configured to sequentially retrieve the analog input voltage accumulated in each of the capacitors of the capacitor array. Further, the comparator circuit is configured to compare the analog input voltage with the reference voltage defined in advance to generate the digital signal.

Further, in the AD conversion circuit in the embodiment, in the state that the AD conversion operation is stopped, the sampling time adjusting circuit is configured to measure the period of time when the voltage, which increases on the input side of the sample hold circuit according to the adjustment voltage equal to the reference voltage input from the external device connected to the input terminal, reaches the threshold value (for example, 63.2% of the reference voltage) defined in advance relative to the reference voltage. Further, the sampling time adjusting circuit is configured to set the time determined according to the period of time thus measured as the sampling time in the sample hold circuit relative to the external device. Accordingly, in the embodiment, the AD conversion circuit is configured to perform the sampling relative to the analog input voltage input from the external device for the sampling time, thereby performing the AD conversion operation.

In the embodiment, it is noted that the sampling time adjusting circuit is configured to set the sampling time by multiplying the period of time thus measured by the value corresponding to the accuracy defined in advance (for example, eight). Further, the threshold value is determined as the ratio of the adjustment voltage less than one relative to the reference voltage In the embodiment, the storage unit (for example, the non-volatile storage unit) may be provided for storing the period of time measured with the sampling time adjusting circuit and the sampling time thus set.

In the embodiment, it is noted that the sampling time adjusting circuit is formed of the comparator 11 for comparing the adjustment voltage with the threshold value, and for outputting the signal indicating that the adjustment voltage reaches the threshold value. Further, the sampling time adjusting circuit is formed of the counter 16 for measuring the period of time from when the adjustment voltage is input to the sample hold circuit to when the counter 16 outputs the signal. Further, the sampling time adjusting circuit is formed of the micro-computer 20 for calculating the sample hold time using the period of time measured with the counter 16.

In the embodiment, it is noted that the sampling time adjusting circuit is further formed of the resistors R1 and R2 for dividing the reference voltage and inputting the divided voltage as the threshold value to the comparator circuit 32b. It is configured such that the resistivity values of the resistors R1 and R2 are set so that the adjustment voltage, which is increased according to the time constant $\tau$ of the input impedance and the internal conversion capacitor, is less than 100% of the reference voltage, and the signal is output from the comparator 11.

In particular, in the sampling time adjusting circuit in the embodiment, the resistivity values of the resistors R1 and R2 are set so that the voltage thus divided and input to the comparator 11 becomes 63.2% of the reference voltage.

In the embodiment, the resistors R1 and R2 may be formed of variable resistors. When the resistors R1 and R2 are formed of variable resistors, it is possible to automatically adjust the sampling time with arbitrary accuracy.

In the embodiment, the micro-controller is formed of the AD conversion circuit having the configuration described above and the CPU for controlling the operation of the AD conversion circuit. Further, the micro-controller is configured to perform the method for adjusting the sampling time in the AD conversion circuit.

In the embodiment, the method of adjusting the sampling time in the AD conversion circuit includes the first step of measuring the period of time when the voltage, which increases on the input side of the sample hold circuit according to the adjustment voltage equal to the reference voltage input from the external device connected to the input terminal, reaches the threshold value defined in advance relative to the reference voltage (for example, 63.2% of the reference voltage). Further, the method of adjusting the sampling time in the AD conversion circuit includes the second step of setting the time determined according to the period of time thus measured in the first step as the sampling time of the analog input voltage in the AD conversion circuit relative to the external device.

As described above, in the embodiment, the adjustment voltage is compared with the internal reference voltage. Then, the counter 16 operates at the operation clock of the AD conversion circuit, and performs the counting operation until the adjustment voltage becomes greater than the threshold value (for example, 63.2% of the reference voltage) defined in advance relative to the internal reference voltage. In the next step, it is configured to determine the period of time reaching the time constant τ of the input impedance of the external device and the internal conversion capacitor of the AD conversion circuit. Accordingly, it is possible to automatically determine the sampling time of the internal input voltage Vain of the AD conversion circuit using the period of time thus determined.

As explained above, when the sampling time is set eightfold of the counter value (time of 1τ), the internal conversion capacitor is charged up to 99.9665% relative to the voltage fully charged in the internal conversion capacitor (τ=1−exp−8=0.999665). Accordingly, the error becomes 0.0335% relative to the voltage fully charged in the internal conversion capacitor at "τ=1−exp−8". In the case of a 10 bit AD conversion circuit, 1 LSB corresponds to about 0.097% ($1/2^{10}$=1/1024=about 0.00097). Accordingly, when the sampling time is set eightfold of the counter value (time of 1τ), the error corresponds to one-third of the accuracy at 10 bit (0.34 LSB). In other words, the internal conversion capacitor is charged at one-third of the accuracy at 10 bit (0.34 LSB), and it is suffice as the sampling time of the AD conversion circuit.

Further, after the sampling time is measured once, when the measurement result is stored in a non-volatile memory such as a flash memory, it is possible to eliminate a redundant measurement of the sampling time every time the AD conversion circuit is turned on.

It should be noted that it is possible to dispose the AD conversion circuit in the embodiment in a general microcontroller. Further, it is possible to adopt the AD conversion circuit to an IC (Integrated Circuit) for a fire alarm or an IC of a rice cooker.

Further, it should be noted that the present invention is not limited to the embodiment described with reference to FIGS. 1 to 4, and may be modified within a scope thereof. For example, in the embodiment, the CPU retrieves and executes the program stored in the memory to control the sampling time adjusting circuit. Alternatively, a hardware configuration formed of a logic element circuit may be configured to control the sampling time adjusting circuit.

Further, in the embodiment, the AD conversion circuit of 10 bit is described, and the present invention is not limited thereto.

Further, in the embodiment shown in FIG. 1, the adjustment voltage is input to the plus input terminal of the comparator 11, and the divided voltage of the reference voltage is input to the minus input terminal of the comparator 11. Alternatively, the input terminals are inverted, and an inverter may be disposed on the output terminal side of the comparator 11.

Further, in the embodiment, the sampling time adjusting circuit is formed of the comparison unit, the measurement unit, and the calculation unit. As shown in FIG. 1, the comparison unit, the measurement unit, and the calculation unit are formed of the comparator 11, the resistors R1 and R2, the flip-flop 13, the flip-flop 14, the double input AND gate 15, and the counter 16. The present invention is not limited to the configuration, and the sampling time adjusting circuit may be modified appropriately.

Further, in the embodiment, the threshold value is set to be 63.2% of the reference voltage, so that the period of time reaching the time constant τ of the input impedance of the external device and the internal conversion capacitor of the AD conversion circuit is determined. In the next step, using the period of time, the sampling time of the analog input voltage Vain of the AD conversion circuit is automatically adjusted. Alternatively, the period of time reaching double or triple of the time constant τ (2τ or 3τ) may be determined, so that using the period of time, the sampling time of the analog input voltage Vain of the AD conversion circuit is automatically adjusted.

Further, the threshold value may be set to be 50% of the reference voltage. In this case, the multiplication of the period of time obtained with the threshold value is determined such that the accuracy of the specification of the AD conversion circuit is satisfied. However, for example, when the threshold value is set to be an extreme value such as greater than 90% or less than 10% of the reference voltage, it is necessary to improve the accuracy of the comparator 11. In particular, when the threshold value is set to be an extreme high value, it would take a long time to retrieve the counter value.

The disclosure of Japanese Patent Application No. 2012-047127, filed on Mar. 2, 2012, is incorporated in the application by reference.

While the invention has been explained with reference to the specific embodiments of the invention, the explanation is illustrative and the invention is limited only by the appended claims.

What is claimed is:

1. An AD (analog-to-digital) conversion circuit, comprising:
   a capacitor array formed of a plurality of capacitors;
   a sample hold circuit configured to apply an analog input voltage input through an input terminal to the capacitor array so that the analog input voltage is accumulated in the capacitor array until a sampling time set is elapsed;
   a comparator circuit configured to sequentially retrieve the analog input voltage accumulated in each of the capacitors of the capacitor array, said comparator circuit being configured to compare the analog input voltage with a reference voltage defined in advance to generate a digital signal; and
   a sampling time adjusting circuit configured to measure a period of time when a voltage, which increases according to an adjustment voltage input from an external device connected to the input terminal, on an input side of the sample hold circuit connected to the input terminal reaches a threshold value defined in advance relative to the reference voltage, said sampling time adjusting circuit being configured to set a time determined according to the period of time thus measured as the sampling time.

2. The AD conversion circuit according to claim 1, wherein said sampling time adjusting circuit is configured to multiply the period of time by a value corresponding to an accuracy defined in advance to set the time as the sampling time.

3. The AD conversion circuit according to claim 2, wherein said sampling time adjusting circuit is configured to measure the period of time when the voltage reaches the threshold value defined in advance as a ratio of the adjustment voltage less than one relative to the reference voltage.

4. The AD conversion circuit according to claim 1, further comprising a storage unit for storing the period of time measured with the sampling time adjusting circuit or the sampling time set with the sampling time adjusting circuit.

5. The AD conversion circuit according to claim 1, wherein said sampling time adjusting circuit includes a comparison unit for comparing the adjustment voltage with the threshold value to output a signal indicating that the adjustment voltage reaches the threshold value, a measurement unit for measuring the period of time from when the adjustment voltage is input to the sample hold circuit to when the comparison unit outputs the signal, and a calculation unit for calculating the sampling time using the period of time.

6. The AD conversion circuit according to claim 5, wherein said sampling time adjusting circuit further includes a first resistor and a second resistor for dividing the reference voltage to obtain a divided voltage so that the divided voltage is input to the comparison unit as the threshold value, and said first resistor and said second resistor are configured to have resistivity values so that the comparison unit outputs the signal when the adjustment voltage increasing according to a time constant of an input impedance of the external device and the capacitor array becomes less than 100% of the reference voltage.

7. The AD conversion circuit according to claim 5, wherein said sampling time adjusting circuit further includes a first resistor and a second resistor for dividing the reference voltage to obtain a divided voltage so that the divided voltage is input to the comparison unit as the threshold value, and said first resistor and said second resistor are configured to have resistivity values so that the divided voltage becomes 63.2% of the reference voltage.

8. The AD conversion circuit according to claim 1, wherein said sampling time adjusting circuit further includes a first resistor and a second resistor for dividing the reference voltage to obtain a divided voltage.

9. The AD conversion circuit according to claim 8, wherein said first resistor and said second resistor are formed of variable resistors.

10. A micro-controller comprising the AD conversion circuit according to claim 1 and a central processing device for controlling the AD conversion circuit.

11. A method of adjusting a sampling time in an AD conversion circuit, wherein said AD conversion circuit includes a capacitor array formed of a plurality of capacitors; a sample hold circuit configured to apply an analog input voltage input through an input terminal to the capacitor array so that the analog input voltage is accumulated in the capacitor array until a sampling time set is elapsed; and a comparator circuit configured to sequentially retrieve the analog input voltage accumulated in each of the capacitors of the capacitor array, said comparator circuit being configured to compare the analog input voltage with a reference voltage defined in advance to generate a digital signal, said method of adjusting the sampling time comprising, a first step of measuring a period of time when a voltage on an input side of the sample hold circuit, which increases according to an adjustment voltage input from an external device connected to the input terminal, reaches a threshold value defined in advance relative to the reference voltage; and a second step of setting a time through multiplying a value corresponding to an accuracy defined in advance and the period of time thus measured as the sampling time.

12. An AD (analog-to-digital) conversion circuit, comprising:

a capacitor array formed of a plurality of capacitors;
a sample hold circuit configured to apply an analog input voltage input through an input terminal to the capacitor array so that the analog input voltage is accumulated in the capacitor array until a sampling time set is elapsed;
a comparator circuit configured to sequentially retrieve the analog input voltage accumulated in each of the capacitors of the capacitor array, said comparator circuit being configured to compare the analog input voltage with a reference voltage defined in advance to generate a digital signal; and
a sampling time adjusting circuit configured to measure a period of time when a voltage, which increases according to an adjustment voltage input from an external device connected to the input terminal, on an input side of the sample hold circuit connected to the input terminal reaches a threshold value defined in advance relative to the reference voltage, said, sampling time adjusting circuit being configured to set a time through multiplying a value corresponding to an accuracy defined in advance and the period of time thus measured as the sampling time.

13. An AD (analog-to-digital) conversion circuit, comprising:

a capacitor array formed of a plurality of capacitors;
a sample hold circuit configured to apply an analog input voltage input through an input terminal to the capacitor array so that the analog input voltage is accumulated in the capacitor array until a sampling time set is elapsed;
a comparator circuit configured to sequentially retrieve the analog input voltage accumulated in each of the capacitors of the capacitor array, said comparator circuit being configured to compare the analog input voltage with a reference voltage defined in advance to generate a digital signal; and
a sampling time adjusting circuit configured to set the sampling time,
wherein said sampling time adjusting circuit includes a comparison unit for comparing an adjustment voltage input from an external device connected to the input terminal with a threshold value to output a signal indicating that the adjustment voltage reaches the threshold value, a measurement unit for measuring the period of time from when the adjustment voltage is input to the sample hold circuit to when the comparison unit outputs the signal, and a calculation unit for calculating the sampling time using the period of time.

14. An AD (analog-to-digital) conversion circuit, comprising:

an input terminal connected to an external device for inputting an analog input voltage or an adjustment voltage from the external device;
a capacitor array formed of a plurality of capacitors;
a sample hold circuit configured to apply the analog input voltage input through the input terminal to the capacitor array so that the analog input voltage is accumulated in the capacitor array until a sampling time set is elapsed, said sample hold circuit including a terminal connected to the input terminal;
a comparator circuit configured to sequentially retrieve the analog input voltage accumulated in each of the capacitors of the capacitor array, said comparator circuit being configured to compare the analog input voltage with a reference voltage defined in advance to generate a digital signal; and
a sampling time adjusting circuit connected to the input terminal and the terminal,
wherein said sampling time adjusting circuit is configured to measure a period of time when a voltage, which increases according to the adjustment voltage input to the input terminal from the external device, on an input side of the sample hold circuit reaches a threshold value defined in advance relative to the reference voltage, and said sampling time adjusting circuit is configured to set a time determined according to the period of time thus measured as the sampling time.

* * * * *